(12) United States Patent
Johnson et al.

(10) Patent No.: US 6,434,081 B1
(45) Date of Patent: Aug. 13, 2002

(54) CALIBRATION TECHNIQUE FOR MEMORY DEVICES

(75) Inventors: Brian Johnson; Brent Keeth, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/570,481

(22) Filed: May 12, 2000

(51) Int. Cl.$^7$ .................................................. G11C 8/00
(52) U.S. Cl. .................... 365/233; 365/187.07; 365/194
(58) Field of Search ............................ 365/233, 189.05, 365/189.07, 189.08, 194, 230.08

(56) References Cited

U.S. PATENT DOCUMENTS

| | | | | |
|---|---|---|---|---|
| 4,905,200 A | * | 2/1990 | Pidsosny | 365/189.07 |
| 5,386,392 A | * | 1/1995 | Cantiant | 365/233 |
| 5,841,580 A | | 11/1998 | Farmwald et al. | 365/194 |
| 5,917,760 A | | 6/1999 | Miller | 365/189.05 |
| 5,923,613 A | * | 7/1999 | Tien et al. | 365/233 |
| 5,953,263 A | | 9/1999 | Farmwald et al. | 365/194 |
| 6,016,282 A | | 1/2000 | Keeth | 365/233 |
| 6,035,365 A | | 3/2000 | Farmwald et al. | 365/230.03 |
| 6,038,195 A | | 3/2000 | Farmwald et al. | 365/233 |
| 6,041,419 A | | 3/2000 | Huang et al. | 713/401 |
| 6,067,592 A | | 5/2000 | Farmwald et al. | 365/233 |
| 6,101,152 A | | 8/2000 | Farmwald et al. | 365/233 |
| 6,154,821 A | * | 11/2000 | Barth et al. | 365/233 |
| 6,295,246 B2 | * | 9/2001 | Jeddeloh | 365/233 |

OTHER PUBLICATIONS

Gillingham; "SLDRAM Architectural and Functional Overview", SLDRAM Consortium, Aug. 29, 1997, pp. 1–14.

* cited by examiner

Primary Examiner—Trong Phan
(74) Attorney, Agent, or Firm—Dickstein Shapiro Morin & Oshinsky LLP

(57) ABSTRACT

Disclosed is an improved start-up/reset calibration apparatus and method for use in a memory device One of a plurality of data paths is bit wise calibrated relative to a clock signal and thereafter others of the plurality of data paths are bit wise aligned to a previously calibrated data path to produce serial and parallel bit alignment on all data paths.

104 Claims, 8 Drawing Sheets

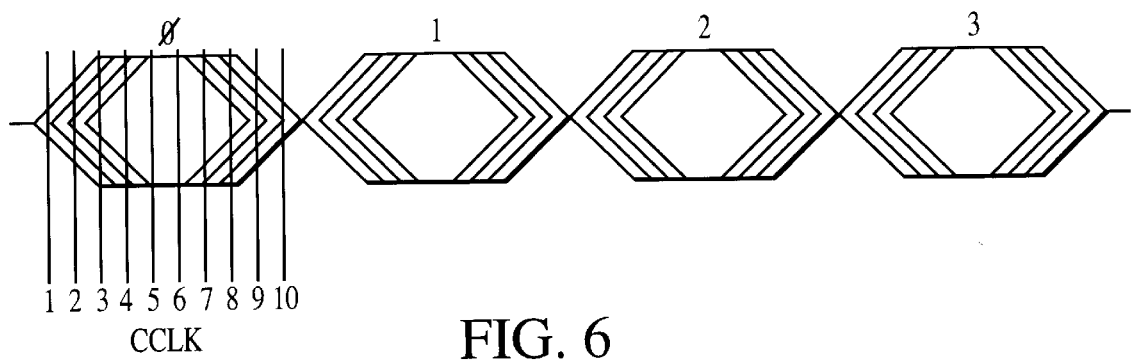
FIG. 6
| $D_1$ | $D_2$ | $D_3$ | $D_4$ | $D_5$ | $D_6$ | $D_7$ | $D_8$ | $D_9$ | $D_{10}$ |
|---|---|---|---|---|---|---|---|---|---|
| 0 | 0 | 0 | 1 | 1 | 1 | 1 | 0 | 0 | 0 |
FIG. 7
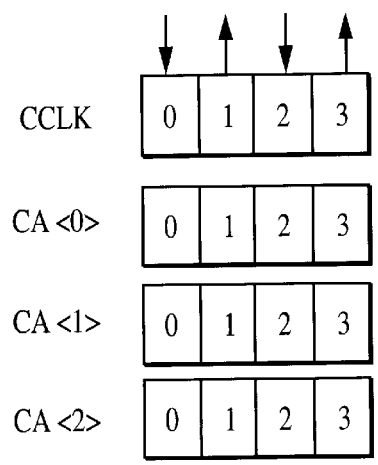
FIG. 8

CALIBRATION TECHNIQUE FOR MEMORY DEVICES

FIELD OF THE INVENTION

The present invention relates to an improved binary calibration technique which is useful for calibrating the timing of control and data signals in memory devices, for example, SLDRAM memory devices.

DISCUSSION OF THE RELATED ART

Memory devices are constantly evolving in the directions of faster speed and higher memory density. To this end, dynamic random access memory (DRAM) devices have evolved from simple DRAM devices to extended data out DRAM (EDO DRAM) to synchronous dynamic random access memory (SDRAM) to double data rate synchronous dynamic random access memory (DDR SDRAM) to SyncLink dynamic random access memory (SLDRAM), the latter of which is the subject of much current industry interest. SLDRAM has a high sustainable bandwidth, low latency, low power, user upgradability and support for large hierarchical memory applications. It also provides multiple independent banks, fast read/write bus turn-around, and the capability for small fully pipelined bursts.

One characteristic of SLDRAM is that it is a double data rate device which uses both the positive- and negative-going edges of a clock cycle to READ and WRITE data to the memory cells and to receive command and FLAG data from a memory controller.

An overview of SLDRAM devices can be found in the specification entitled "SLDRAM Architectural and Functional Overview," by Gillingham, 1997 SLDRAM Consortium (Aug. 29, 1997), the disclosure of which is incorporated by reference herein.

Because of the required high speed operation of SLDRAM, and other contemporary memory devices, system timing and output signal drive level calibration at initialization, including start-up or reset, is a very important aspect of the operation of such devices to compensate for wide variations in individual device parameters.

One of the several calibration procedures which is performed in current SLDRAM devices is a timing synchronization of clock signals CCLK (command clock signal) and DCLK (data clock signal) with data provided on an incoming command path CA and FLAG path (for the CCLK signal) and on the data paths DQ (for the DCLK signal) so that incoming data is correctly sampled. Currently, a memory controller achieves this timing calibration at system initialization by sending continuous CCLK and DCLK transitions on those clock paths and transmitting inverted and non-inverted versions of a 15 bit repeating pseudo random SYNC pattern "111101011001000" on each of the data paths DQ, the command path CA, and the FLAG path. The SLDRAM recognizes this pseudo random sequence by two consecutive ones "1" appearing on the FLAG bit and determines an optimal internal delay for CCLK and DCLK relative to the data each clocks to optimally sample the known bit pattern. This optimal delay is achieved by adjusting the temporal position of the received data bits to achieve a desired bit alignment relative to the clock. This is accomplished by adjusting a delay in the receiving path of the received data until the received data is properly sampled by the clock and recognized internally. Once synchronization has been achieved, that is, the proper delays on the data receiving paths have been set, the memory controller stops sending the SYNC pattern and the SLDRAM, after all calibrations are completed, can be used for normal memory READ and WRITE access.

In prior synchronizing schemes using a calibration bit pattern as discussed above, all incoming data can properly be aligned with respect to the clock used to latch in the data by adjusting the data delays relative to the clock (CCLK or DCLK) to position a sampling clock edge at or near the center of the data "eye" or "window" where the data is valid on an incoming data path. However, this calibration procedure is independently carried out for each incoming data path, which may take some time and which also may, in extreme cases, cause the data "eye" on different incoming data paths to be aligned on different edges of the clock signal.

FIG. 1, for example, shows raw data coming into an SLDRAM module from a memory controller for a representative FLAG data path, and three of the command bus data paths CA<0>, CA<1> and CA<2> (there are actually ten such data paths for the exemplary SLDRAM command bus). As shown, data positions arriving on each of the representative FLAG and CA<0>, CA<1> and CA<2> data paths are all skewed relative to one another.

When the conventional calibration procedure is performed using the 15 bit pseudo random pattern described above, each of the data bits on each of the incoming data paths is properly serially aligned with an edge of clock signal CCLK, as shown in FIG. 2, for the exemplary data paths FLAG and CA<0>, CA<1> and CA<2>. That is, the clock edge CCLK is at or near the center of the data "eye" or "window" for each data bit on each data path. However, as is also shown in FIG. 2, it is possible that the data bits in one data path are misaligned, or aligned to an edge of the clock opposite to that of another data path. For example, while the position of data on the CA<0> data path and the data on the FLAG data path are properly aligned with each other, these two are misaligned with respect to the data bits on the CA<1> and CA<2> data paths. Thus, even though serial calibration of each data line relative to the clock CCLK has been achieved, there is still a possibility for misalignment in a parallel direction across all of the data paths.

SUMMARY OF THE INVENTION

The present invention provides correct alignment of data entering a memory module, e.g., an SLDRAM module, on a plurality of incoming data paths in both a serial and parallel direction. Serial data alignment is first acquired for one of the incoming data paths, and then the remaining data paths are bit wise aligned in parallel to a previously aligned data path. In this way, serial and parallel calibration of all data paths is achieved. This alignment may be performed, for example, at power-up or reset of the memory device.

BRIEF DESCRIPTION OF THE DRAWINGS

The above and other advantages and features of the invention will be more clearly understood from the following detailed description of the invention which is provided in connection with the accompanying drawings in which:

FIG. 6 illustrates a graphic example of the synchronization technique used to synchronize one data path of the SLDRAM system of FIG. 3;

FIG. 7 illustrates a pattern of acceptable delay values for synchronization used in the invention;

FIG. 8 illustrates the serial and parallel alignment of data on the incoming data paths shown in FIG. 1;

DETAILED DESCRIPTION OF THE PREFERRED EMBODIMENTS

An improved method of aligning a data path to a clock signal is described in detail in U.S. patent application Ser. No. 09/568,155, filed May 10, 2000, the disclosure of which is incorporated by reference herein. In order to provide context for the present invention, relevant portions of that application will now be described.

Figure 3:
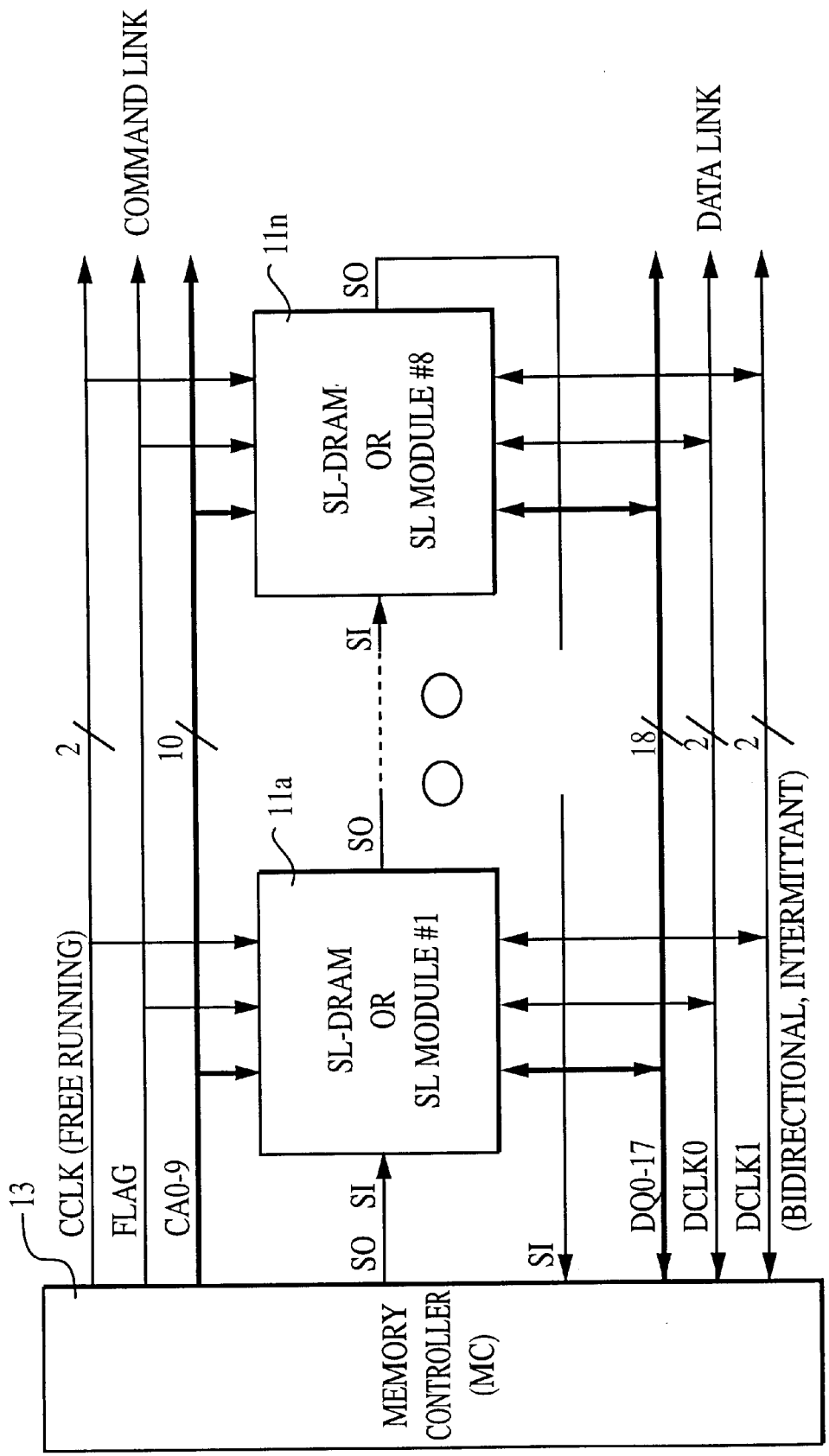
FIG. 3 illustrates an SLDRAM bus topology with which the invention may be used.

An SLDRAM system with which the present invention may be used is illustrated in FIG. 3. It includes a plurality of SLDRAM modules 11a . . . 11n which are accessed and controlled by a memory controller 13. Memory controller 13 provides a command link to each of the SLDRAM modules 11a . . . 11n which includes a clock signal CCLK on inverted and non-inverted clock signal paths, a 1 bit FLAG signal on a FLAG data path, and a 10 bit command bus signal path CA0–9. In addition, SLDRAM input/output enabling signals SO, SI are provided from memory controller 13 in daisy chain fashion to the SLDRAM modules 11a . . . 11n. In addition, a bi-directional data bus DQO-17 is provided between memory controller 13 and each of the SLDRAM modules 11a . . . 11n, as are bi-directional data clocks DCLKO and DCLKI. The clock DCLKO is used to strobe input/output data into and out of the SLDRAM modules, a process for which the DCLKl signal path is also intermittently used.

Figure 4:
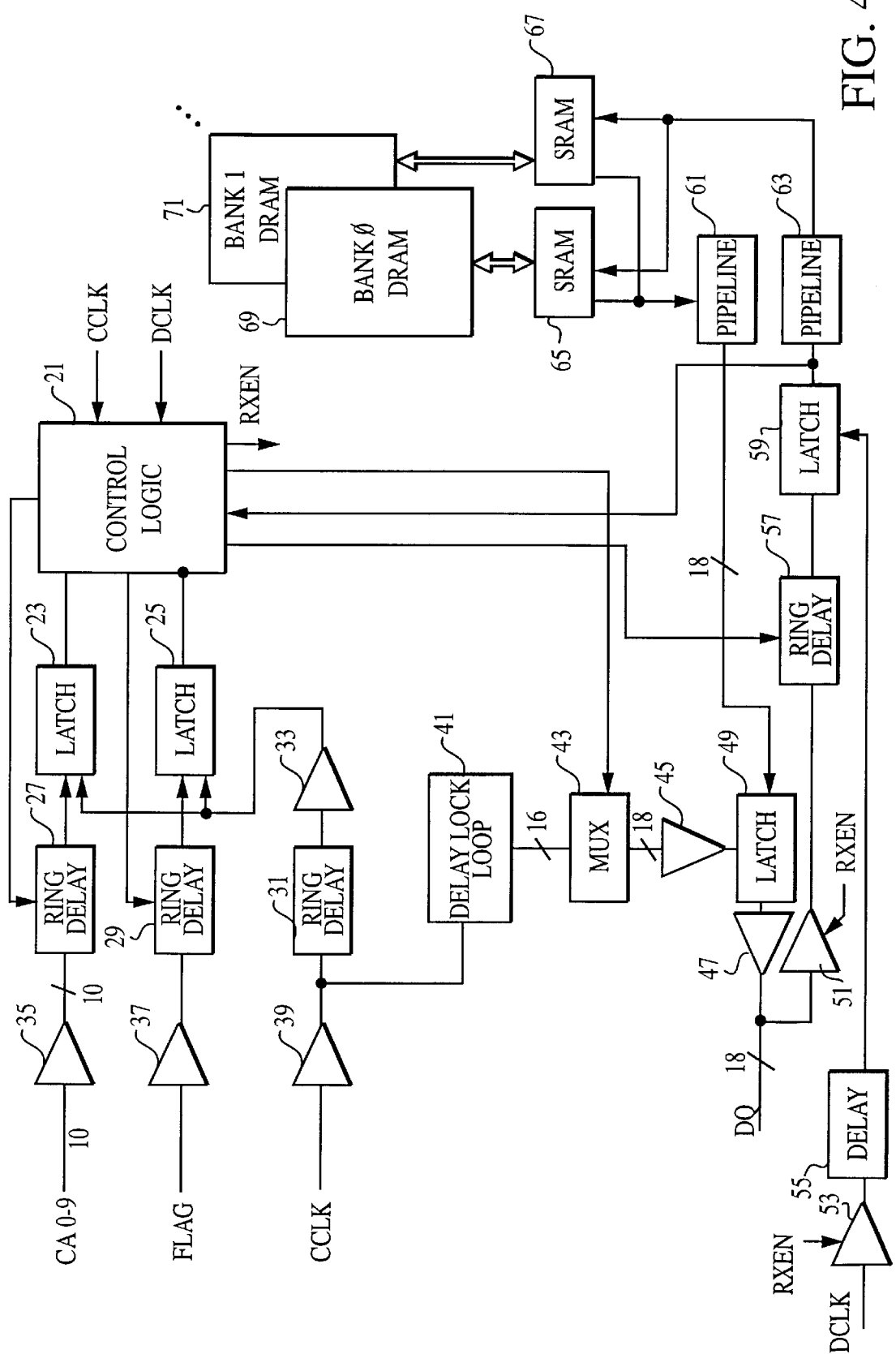
FIG. 4 illustrates a portion of the SLDRAM module shown in FIG. 3.

FIG. 4 illustrates a simplified relevant portion of one of the SLDRAM modules 11a . . . 11n. It includes a control logic circuit 21, latches 23, 25, 49, 59, delay devices 27, 29, 31, 55, 57 which may be ring delay devices, buffers 35, 37, 39, 33, 45, 47, 51, 53, a delay lock loop 41, multiplexer 43, pipeline circuits 61, 63, SRAM input/output circuits 65 and 67, and respective memory banks Bank0 and Bank1 69, 71. It should be noted that although two memory banks are illustrated in FIG. 4, this is just illustrative, as any number of memory banks can be used. Control logic circuit 21 receives and analyzes commands on the CA0–9 bus and controls the input/output (I/O) access operations of the memory banks 69, 71. The control logic circuit 21 also receives the FLAG signal, and the clock signals CCLK, DCLK.

The signals on each of the command bus paths CA0–9 are passed through respective adjustable ring delay circuits 27 and into respective latches 23 where the signals are latched by a CCLK signal, as buffered by buffer 39, delayed by delay 31 and buffered by buffer 33.

The signal CCLK also passes from buffer 39 into a delay lock loop circuit 41 which provides 16 clock signals into a multiplexer 43. The multiplexer provides 18 clock output signals through respective buffers 45 to 18 latches 49 which latch data output from the memory banks 69, 71. The output data from memory banks 69, 71 pass into SRAMS 65, 67 which act as I/O buffers and pass through pipeline circuit 61 before being loaded into latches 49. The output data latched in latches 49 is provided to respective buffer amplifiers 47 and from there is passed back to memory controller 13 (FIG. 3) via data bus DQ.

Data which is to be input to memory banks 69, 71 is supplied by memory controller 13 (FIG. 3) on the DQ data bus, is passed through gated buffers 51 through ring delays 57 on each path of the data bus, into latches 59, through pipeline circuit 63. From pipeline circuit 63, input data on the DQ bus passes into buffer SRAM 65, 67 and into a memory bank 69, 71.

The control logic circuit 21 also issues an enable command RXEN whenever the memory controller indicates a memory access WRITE operation by way of a WRITE command in the data on the command bus CA0–9. The RXEN command enables the data input buffers 51 and a data clock input buffer 53. The data clock DCLK passes through gated buffer 53, delay circuit 55 and is used to control latch 59 to latch in incoming data on the data bus DQ.

In order to ensure proper timing of the various memory operations performed by the SLDRAM modules 11a . . . 11n, the FIG. 4 circuit must be synchronized to ensure that the incoming data is properly clocked in by the clock signals CCLK and DCLK To this end, and in accordance with an invention described in related application Ser. No. 09/568,155, filed May 10, 2000, a $2^N$ bit synchronizing pattern is applied to each of the data input paths CA0–9 and FLAG while the data pattern is sampled in latches 23 and 25 by the delayed clock signal CCLK. The control logic circuit 21 steps through all possible delay positions of ring delays 27 and 29 as the data sampling is performed and stores patterns representing which delay values for the ring delays 27 and 29 provide for a correct sampling and recognition of the $2^N$ bit pattern. In this manner, control logic circuit 21 establishes an "eye" or "window" of acceptable delays for each of the ring delays 27 for the command data paths CA0–9 and for ring delay 29 for the FLAG input path. Once a "window" of acceptable delays is found for each of the ring delays 27 and for the ring delay 29, the control logic circuit 21 determines the "best" delay value as that value which is approximately in the middle of the window. Although a $2^N$ 16 bit pattern is used for this purpose, as described above calibration can also be achieved by using a $2^{N}-1$ bit pattern, for example, with a 15 bit pseudo random pattern, as described in the SLDRAM specification referenced above.

Figure 5:
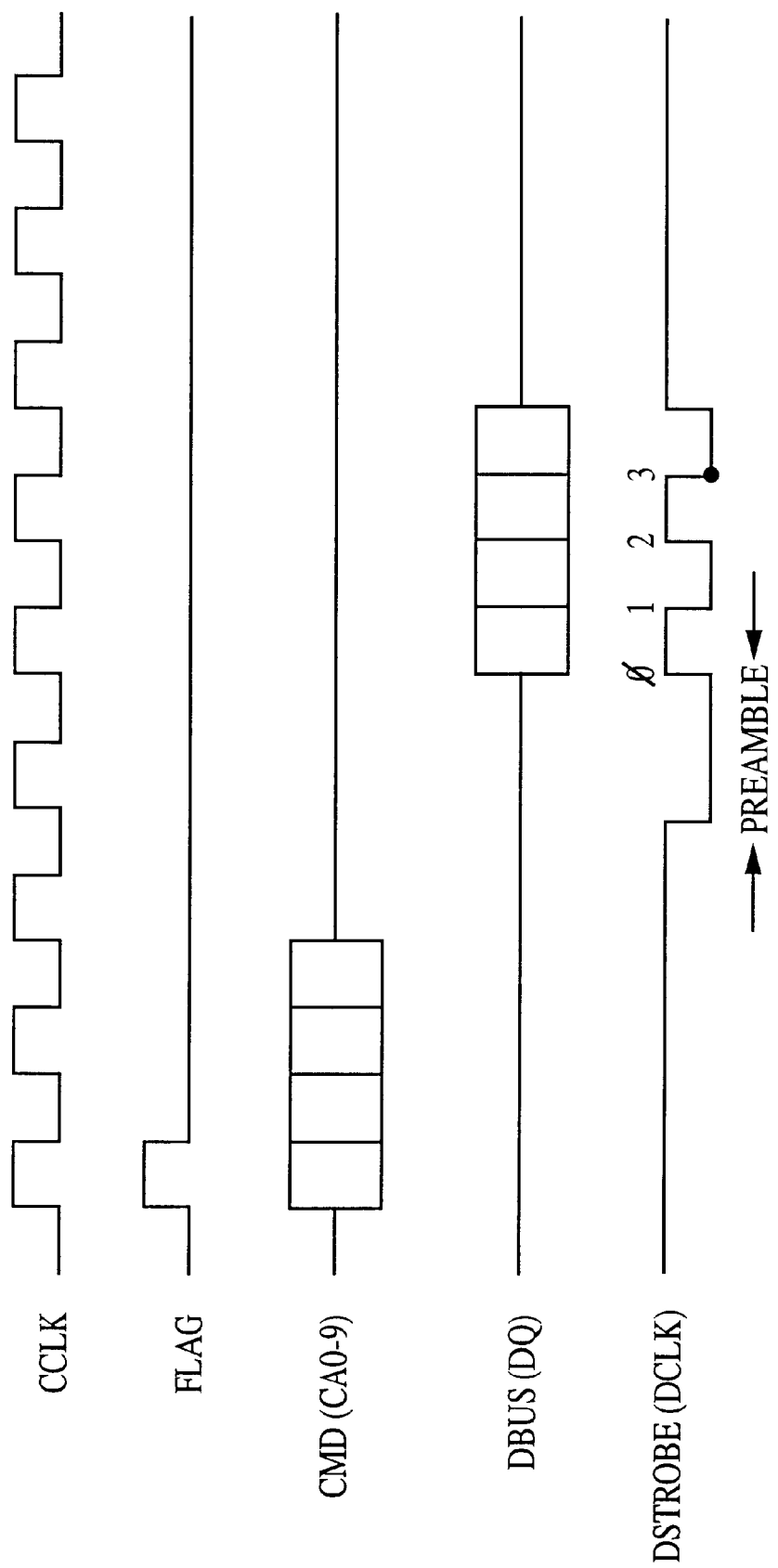
FIG. 5 illustrates a simplified timing diagram illustrating a portion of the timing signals used in the operation of the circuit of FIG. 4.

To illustrate the calibration process, calibration of the data appearing on the FLAG data path will be discussed using a $2^N$ 16 bit synchronization pattern, it being understood that the same calibration process may be carried out on any one of the data paths of the command bus CA0–9 and any one of the receive data paths of the data bus DQ (although for the latter the DCLK signal is used for clocking). FIG. 5 illustrates a simplified timing diagram showing the timing relationship of the clock signal CCLK, the FLAG signal, the command bus signal CMD, a data bus signal DQ/DBUS and a data strobe signal DCLK. As shown, four bits of data on a DQ path of the data bus (DBUS) are clocked in on four sequential positive and negative going transitions of the data clock signal DCLK after an initial PREAMBLE portion of DCLK appears. The data present on the command signal paths CA0–9 and on the FLAG path is clocked in by sequential positive and negative going transitions of the command clock signal CCLK.

Returning to FIG. 4, it can be seen that the data entering on the FLAG signal path passes through ring delay circuit 29 and is latched in latch 25 by the command clock signal CCLK. This data is then serially applied to control logic circuit 21. During the calibration period, a known $2^N$ bit synchronization pattern is applied to the FLAG path by memory controller 13 (FIG. 3), together with the free running clock signal CCLK. The control logic circuit 21 knows what the $2^N$ bit calibration pattern is as it is stored and/or generated therein, and reads the incoming repeating pattern on the FLAG data path bit-by-bit from latch 25. When doing so, the control logic circuit 21 first sets ring delay 29 for the FLAG path to one known delay setting. The control logic circuit 21 then examines the bit pattern sequentially received from latch 25 to see if it matches the known synchronization bit pattern. If the timing of the synchronization pattern data on the FLAG path is not aligned with the transitions of the CCLK signal, the correct bit pattern is not recognized at the output of latch 25 and the control logic circuit 21 will adjust ring delay 29 to the next delay setting, offset by a given amount from the prior delay setting of ring delay 29. Control logic circuit 21 will again continue to examine the bit pattern emerging from latch 25 to see if it matches the known synchronization bit pattern. If not, it continues to increment the delay value of the ring delay 29 and repeats the sampling and examination process until the correct $2^N$ bit is recognized. In lieu of stopping the calibration process when the correct synchronization bit pattern is recognized at the output of latch 25, the control logic circuit 21 will actually step through all possible delay values of ring delay 29 and keep track of which delays produced a proper recognition of the $2^N$ bit synchronization pattern. Then the control logic circuit 21 will select as a final delay value for ring delay 29, that value which is approximately centered between all delay values which produced a proper recognition of the $2^N$ bit synchronization pattern.

FIG. 6 illustrates the data envelope or "eye" for four consecutive bits <0><1><2><3> of the $2^N$ bit synchronization pattern together with the clock signals CCLK which latch the data in latch 25. The relative timing of the data envelope and the control data clock CCLK is illustrated as ten possibilities of CCLK 1 . . . 10, that is, ten possible delay values for ring delay 29. The beginning and end of the data envelope is where the data on the FLAG data path is unstable which leads to erroneous sampling of the data. As shown, reliable data capture occurs at the relative timing locations $C_4$ through $C_7$, while unreliable data capture occurs at the relative timing locations $C_1$ . . . $C_3$ and $C_8$ . . . $C_{10}$. These are represented within control logic circuit 21 as delay values $D_4$ . . . $D_7$, where the $2^N$ bit synchronizing pattern was properly recognized.

FIG. 7 illustrates how acceptable and unacceptable delay values are represented in control logic circuit 21 where delay values $D_1$ . . . $D_3$ and $D_8$ . . . $D_{10}$ show a "0" logic state representing that the $2^N$ bit synchronization pattern was not recognized and the logic state "1" for delay values $D_4$ . . . $D_7$, indicating a proper recognition of the $2^N$ bit synchronization pattern. It should be understood that although only 10 relative delay states of the data to the command clock signal CCLK are shown for simplicity, in actual practice there may be many more possible delay states for ring delay 29 and the delay state pattern illustrated in FIG. 7.

Once the delay state pattern shown in FIG. 7 is developed by control logic circuit 21, it selects as a final delay for ring delay 29 a delay value which is approximately in the center of those delay values, e.g., $D_4$ . . . $D_7$, which produced a proper recognition of the $2^N$ bit synchronization pattern. In the example illustrated, the final delay would be selected as $D_5$ or $D_6$. Once this value is set for ring delay 29, the FLAG data path has been calibrated.

Although the same calibration procedure may also be applied to each of the CMD data paths CA0–9 and to each of the data paths of the DQ bus, (except that for the DQ bus, the data clock DCLK is used to latch the data in latch 59 which is present in each of the data paths of the DQ data bus, as described above), this will not ensure parallel alignment of the data across all of the incoming data paths.

Figure 1:
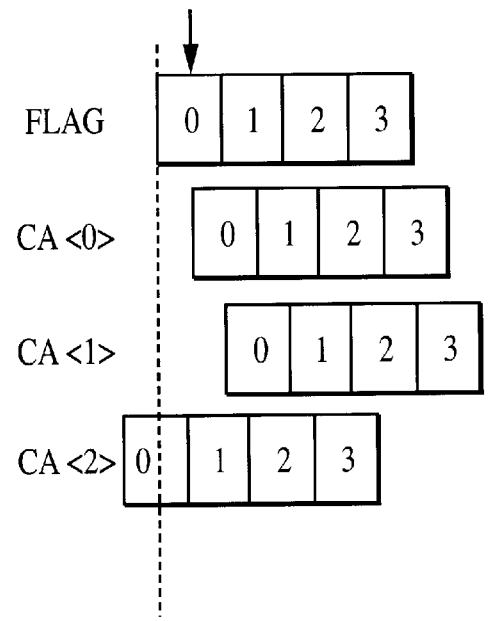
FIG. 1 illustrates raw data incoming on four different incoming data paths of a memory device.
Figure 2:
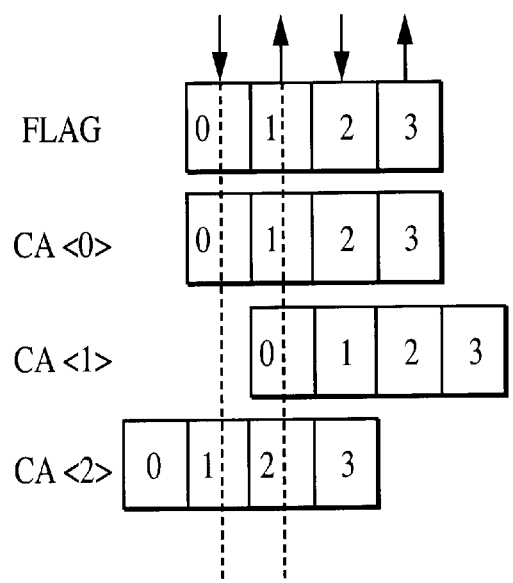
FIG. 2 illustrates a serial alignment of the data bits incoming on the different data paths shown in FIG. 1.

As previously noted, in an extreme case the independent serial alignment of the data paths can produce bit wise errors in the parallel direction of the data lines, which can be seen by comparing FIG. 2 with FIG. 8. FIG. 2 illustrates an example in which the FLAG, CA<0>, CA<1> and CA<2> data paths have each undergone serial, but not parallel alignment. The result shows that each data path is aligned with the clock such that rising and falling edges (shown at the top of FIG. 2) of the clock are aligned with the center of the respective data eye for each data path. However, the initial bits in the CA<1> and CA<2> data paths were serially aligned with an incorrect clock edge, resulting in parallel alignment errors relative to the other data paths.

In contrast, FIG. 8 shows the same data paths FLAG, CA<0>, CA<1> and CA<2> after undergoing both serial and parallel alignment. Each data path has its data eye correctly centered on a rising or falling clock edge (serial alignment), and corresponding bits match across all data paths (parallel alignment).

Accordingly, in the present invention, one of the data lines, e.g., FLAG, is first serially calibrated using the procedures described above with reference to FIGS. 1–7. Then, instead of calibrating the remaining data lines in the same manner, the remaining data lines are calibrated to a previously calibrated data line, e.g., the FLAG data path. The manner of doing this will next be described with reference to FIGS. 9 and 10.

Figure 9:
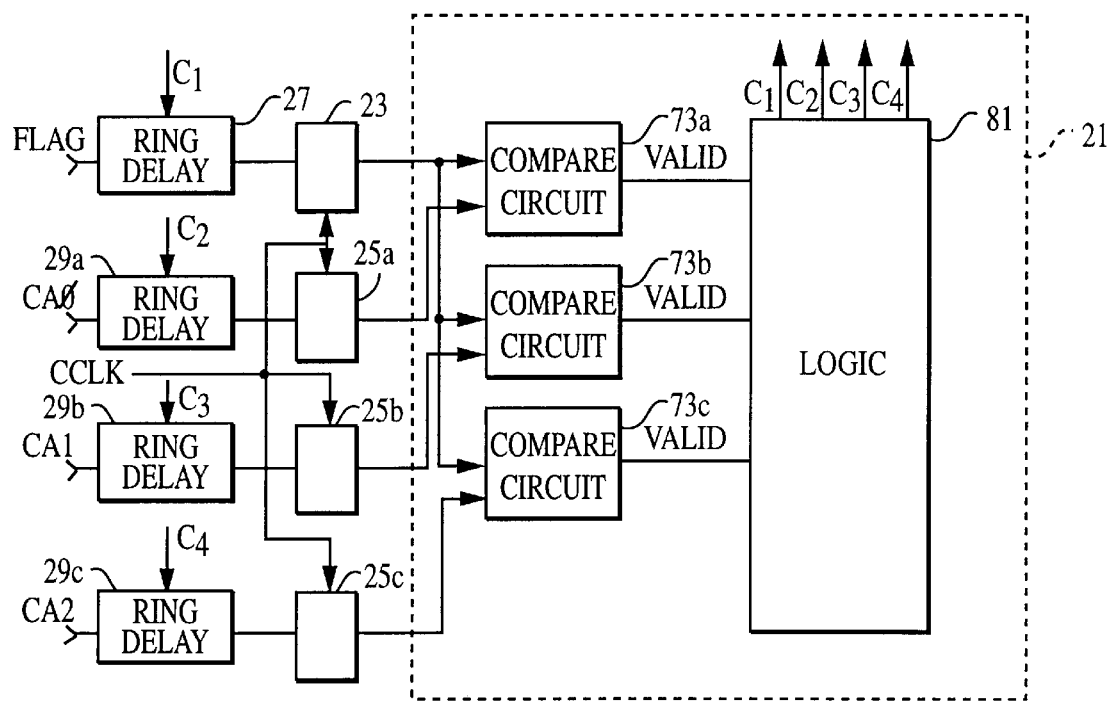
FIG. 9 illustrates an exemplary circuit for implementing a first embodiment of the invention.

FIG. 9 shows a portion of the control logic circuit 21 as including a plurality of compare circuits 73a, 73b, 73c for the illustrated data paths FLAG, CA<0>, CA<1>, and CA<2> which are representative of the data paths FLAG, and CA0–9 and DQ0–17. It should again be noted that while the FLAG and CA0–9 data paths are aligned to CCLK, the data paths DQ0–17 are aligned to DCLIK. Also illustrated are signals C1, C2, C3, C4 used by the logic 81 to control the delay settings of the ring delays 27, 29a, 29b, 29c, respectively. Additionally, VALID signals are generated by the compare circuits 73a, 73b, 73c to signal whether the synchronization pattern is properly recognized to the logic 81.

After one of the incoming data paths, e.g., FLAG, is serially aligned in the manner described above with reference to FIGS. 1–7, the control logic circuit 21 then compares the newly aligned calibration pattern on the aligned data path, e.g., FLAG, with the calibration pattern from another data line, e.g., CA<0>, which is to be aligned. The control logic circuit 21 establishes an initial delay value for the ring delay 29a (via signal C2) of the CA<0> line and compares the outputs from the latch circuit 23 of the previously aligned data path with the latch circuit 25a of the data path undergoing calibration. If there is no pattern match, as detected by the compare circuit 73a, the control logic circuit 21 will increment the ring delay 29a and again look for a comparison of the calibration patterns emerging from latches 23 and 25a. This process of incrementing the ring delay 29a and looking for a match of the calibration patterns from latches 23 and 25a will continue until a match is found. Once a match is found, the control logic 21 will still continue to increment the ring delay 29a and compare the calibration patterns and note if a match occurs until it increments the ring delay 29a through all its possible delay values, including those where a pattern match is not found. This establishes a range of delays where the data on data path CA<0> is both serially aligned as well as aligned in parallel with data on the FLAG data path. The control logic circuit 21 will then set the delay value for ring delay 29a as a value at or near the center of the delay values which produced a match of the calibration patterns emerging from the latch circuits 23 and 25a. While the data path CA<0> is being aligned to the previously aligned FLAG data path, the remaining data paths, e.g., CA<1> or CA<2> can undergo an identical simultaneous alignment (using the above described method modified for the appropriate data path, e.g., using signals C3, C4, ring delays 29b, 29c, and latch circuits 25b, 25c for data paths CA<1>, CA<2>, respectively). In lieu of calibrating the remaining data paths simultaneously, it is also possible to sequentially align each to the previously aligned FLAG data path.

Figure 10:
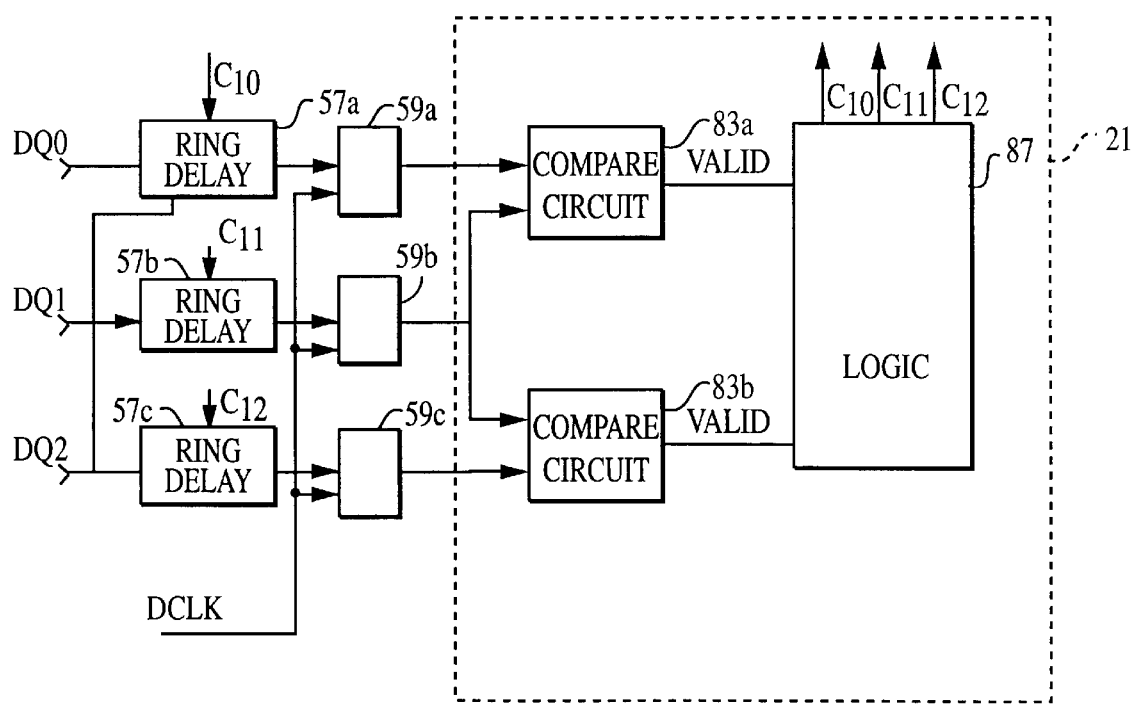
FIG. 10 illustrates an exemplary circuit for implementing a second embodiment of the invention.

Alternatively, control logic circuit 21 can also be arranged to compare a next data path to be calibrated to a just calibrated data path and control the incremental adjustment of the ring delay for the new data path in the manner described above until a final delay value is selected. This is illustrated in FIG. 10, where a previously aligned data path, e.g., DQ<0> which includes ring delay 57a is aligned with a next in sequence data path DQ<1> which includes ring delay 57b. The delay settings of the ring delays 57a, 57b, 57c may be set by logic 87 using signals C10, C11, C12, respectively. This embodiment is illustrated using the data paths for the DQ0–17 data bus. Once a first data path, e.g., DQ0, is serially aligned to DCLK using the technique described with reference to FIGS. 1–7, the remaining DQ1–17 data paths can then be aligned by comparing the calibration pattern of a subsequent non-aligned data path to the calibration pattern which exists on a previously aligned data path. In one example, each data path can be aligned to an immediately preceding just aligned data path. Thus, if DQ0 is the first serially aligned data path, the next data path DQ1 is aligned to the previously aligned DQ0 path. To this end, control logic circuit 21 includes compare circuit 83a, which aligns the DQ1 data path including ring delay 57b to the previously aligned DQ0 data path which includes ring delay 57a by comparing the calibration pattern on aligned data path DQ0 with the calibration pattern on the DQ1 data path to generate an appropriate validity signal on signal lines VALID. As described above, the control logic circuit 21 steps through all possible delay values of ring delay 57b, and notes those delays which produce a coincidence of the calibration pattern on data paths DQ<0> and DQ<1>, and selects a final delay value for delay 57b which is at or near the center of acceptable delays. Likewise, compare circuit 83b aligns the calibration pattern on the data path DQ<2> including ring delay 57c with the calibration pattern on previously aligned data path DQ<1> which includes ring delay 57b.

In a similar manner other unaligned data paths DQ<X> are aligned to a precedingly aligned data path DQ<X−1>. The control logic circuit 21 thus steps through all data paths, aligning the ring delays of a path under calibration to an immediate previously calibrated data path until all data paths have been calibrated.

As noted, the serial alignment procedure for the first data path, e.g., DQ<0>, may use the improved $2^N$ calibration pattern described in U.S. patent application Ser. No. 09/568, 155, filed May 10, 2000 or the $2^{N-1}$ calibration of pattern described in the SLDRAM specification identified above.

Figure 11:
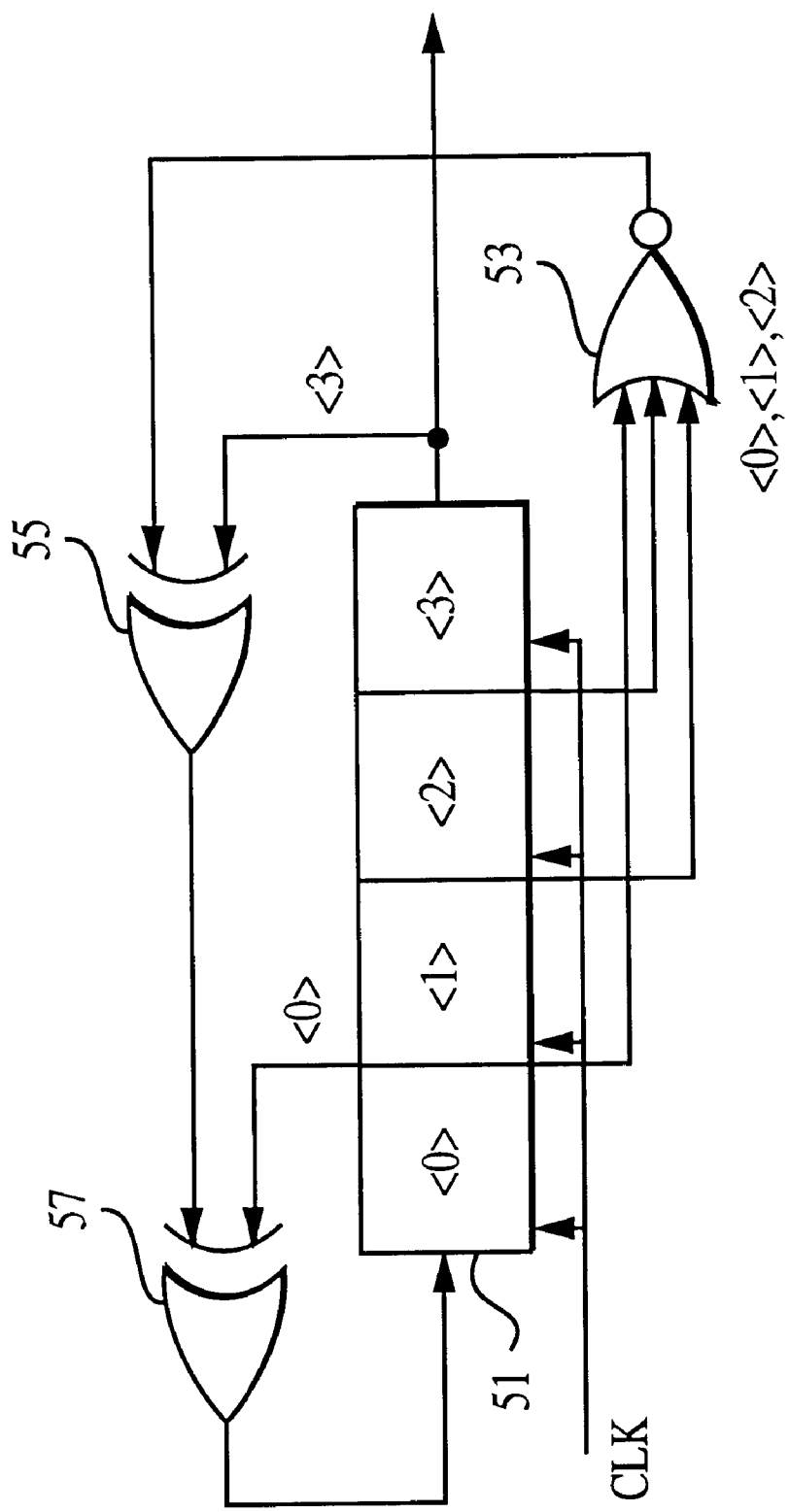
FIG. 11 is a representative circuit for generating a $2^N$ 16 bit code which may be used in the invention.

A circuit for generating the $2^N$ bit calibration pattern, where N=4, to produce a repeating 16 bit pattern, is illustrated in FIG. 11. It includes a four stage shift register 51 having bit positions <0><1><2><3>, NOR gate 53 having three inputs respectively connected to the <0><1><2> outputs of shift register 51, an exclusive OR gate 55 having two inputs respectively connected to the output <3> of shift register 51 and the output of NOR gate 53, and an exclusive OR gate 57 having a pair of inputs respectively connected to the output of exclusive OR gate 55 and the first stage output <0> of shift register 51. The output of exclusive OR gate 57 is applied as an input to stage <0> of shift register 51. The clock signal CLK (or DCLK) is applied to shift register 51. The shift register 51 can initially be seeded with all zeroes "0" at stages <0><1><2><3> and it will generate the repeating 16 bit pattern "1111010110010000." This pattern is similar to the 15-bit pseudo random pattern "111101011001000" described in the SLDRAM specification, but includes an additional bit, e.g. a "0" added to the 15-bit pattern. In lieu of generating the repeating bit pattern with a circuit, the pattern can also be stored in the memory controller 13 (FIG. 3) and repeatedly read out during calibration.

Figure 12:
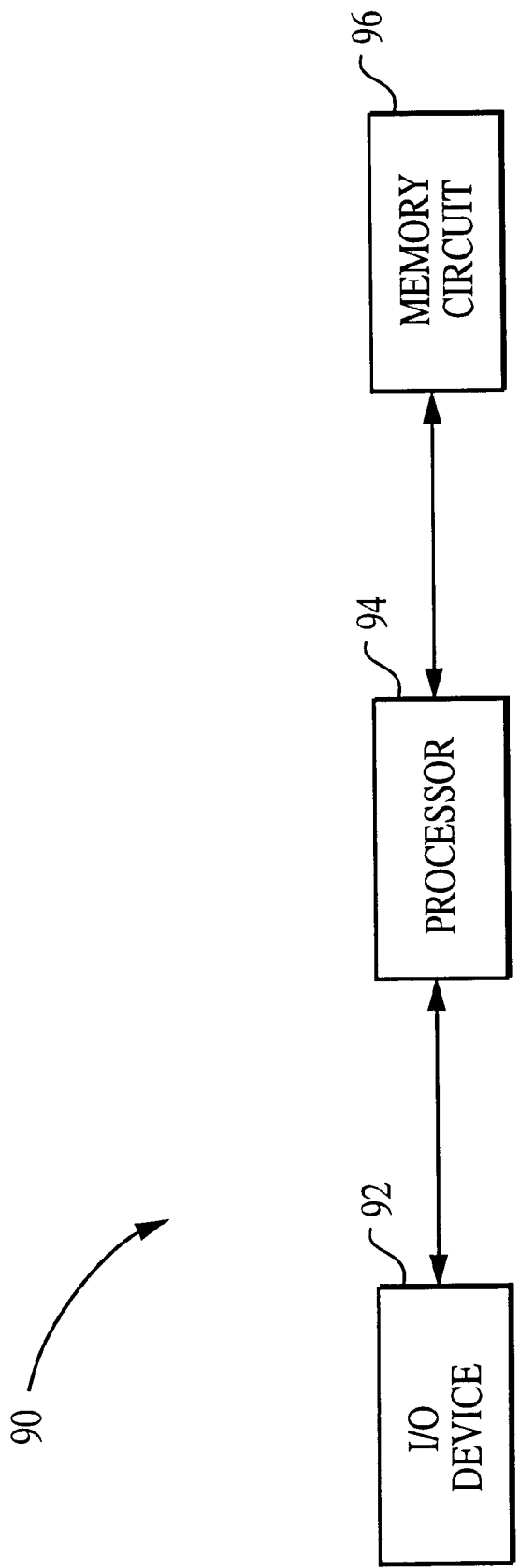
FIG. 12 illustrates a processor based system using a memory device which employs calibration structures and process methodologies in accordance with the invention.

A memory device containing the calibration structure and operating as described above may be used in a processor-based system of the type shown in FIG. 12. The processor-based system 90 comprises a processor 94, a memory device 96, and an I/O (input/output) device 92. The memory device 96 contains the calibration structure operating as described in accordance with the present invention. The memory device may be any type of DRAM device including an SLDRAM. In addition, the processor 94 may itself be an integrated processor which utilizes on-chip memory devices containing the calibration structure and operates in accordance with the present invention.

In the preceding discussion, the apparatus and method of the invention has been described with regard to a memory device which clocks data (i.e., reads or writes data) twice per clock cycle: on both the rising and falling edges of the clock. However, the present invention may be used in any memory device in which calibration is performed, including devices which clock data once per clock cycle, for example on one of either the rising or falling edge of the clock.

While the invention has been described and illustrated with reference to exemplary embodiments, many variations can be made and equivalents substituted without departing from the spirit or scope of the invention. Accordingly, the invention is not to be understood as being limited by the foregoing description, but is only limited by the scope of the appended claims.

What is claimed as new and desired to be protected by Letters Patent of the United States is:

1. A method of calibrating data paths of a memory device, said method comprising:

calibrating a first data path of said memory device to align data present on said first data path relative to a clock signal for clocking in data on said first data path; and calibrating a second data path of said memory device to align data present on said second data path relative to said clock signal using calibrated data from said first data path.

2. A method as in claim 1 further comprising calibrating a third data path of said memory device to align data present on said third data path relative to said clock signal using calibrated data from one of said first and second data paths.

3. A method as in claim 2 wherein said third data path is calibrated using calibrated data from said first data path.

4. A method as in claim 2 wherein said third data path is calibrated using calibrated data from said second data path.

5. A method as in claim 1 wherein said first data path is one of a FLAG data path and a data path of a command bus, and the second data path is the other of said FLAG data path and a data path of said command bus.

6. A method as in claim 1 wherein said first data path is a data path of a data bus and said second data path is another data path of said data bus.

7. A method as in claim 1, wherein said calibration of said second data path comprises comparing calibrated data from said first data path with uncalibrated data from said second data path and adjusting a delay in said second data path to achieve coincidence in calibration data in said first and second data paths.

8. A method as in claim 2, wherein said calibration of said third data path comprises comparing calibration data from one of said first and second data paths with uncalibrated data from said third signal path and adjusting a delay in said third data path to achieve coincidence in calibration data of said third data path and said one of said first and second data paths.

9. A method as in claim 1, wherein the calibration of said first data path comprises:
    generating a repeating first calibration pattern for a period of time;
    applying said first calibration pattern to said first data path; and
    using said applied first calibration pattern and said clock signal to adjust a delay element in said first data path to a delay value which produces a reliable detection of said first calibration pattern.

10. A method as in claim 9, farther comprising setting said delay element to a beginning delay value, using said clock signal to sample an output of said delay element in said first data path and determining if said first calibration pattern is reliably detected at said beginning delay value.

11. A method as in claim 10, wherein if said first calibration pattern is not reliably detected, said method further comprises changing said delay value in said first data path to another delay value and again sampling the output of said delay element and determining if said first calibration pattern is reliably detected.

12. A method as in claim 11, wherein if said first calibration pattern is still not reliably detected, said method further comprises repeating the acts of changing the setting of said delay value, sampling and determining until said first calibration pattern is reliably detected.

13. A method as in claim 9, further comprising setting said adjustable delay element of said first data path to a beginning delay value, sampling the output of said adjustable delay element with said clock signal and determining if said first calibration pattern is reliably detected, and repeating said setting, sampling and determining acts for a plurality of possible delay values to determine which of said possible delay values produce reliable detection of said first calibration pattern.

14. A method as in claim 13, further comprising choosing as a final setting of said delay element one of said delay values which produces reliable detection of said first calibration pattern.

15. A method as in claim 14, wherein said final setting is chosen as a delay value which is approximately at a center of those delay values which produced reliable detection of said first calibration pattern.

16. A method as in claim 1, wherein said calibration method is performed at power-up and reset of said memory device.

17. A method as in claim 9, wherein said first calibration pattern is a $2^N$ bit pattern.

18. A method as in claim 9, wherein said first calibration pattern is a $2^N-1$ bit pattern.

19. A method as in claim 9, wherein said first calibration pattern is a stored pattern.

20. A method as in claim 9, wherein said first calibration pattern is a generated pattern.

21. A method as in claim 1, wherein said clock signal clocks data on at least one of a rising or falling edge of said clock signal.

22. A method as in claim 1, wherein said clock signal clocks data on both rising and falling edges of said clock signal.

23. A method of calibrating a plurality of data paths of a memory device comprising:
    calibrating a first data path of said memory device to align the timing of data present on said first data path relative to a clock signal for clocking in data on said first data path; and
    calibrating remaining data paths of said memory device to align data present on each of said remaining data paths with calibrated data on said first data path to achieve serial and parallel alignment of data on said first and remaining data paths.

24. A method as in claim 23, wherein said remaining data paths are calibrated by comparing uncalibrated data on each of said remaining data paths to calibrated data on said first data path and adjusting a delay element in each of said remaining data paths such that each of said remaining data paths has data thereon aligned with calibrated data on said first data path.

25. A method as in claim 24, wherein each of said remaining data paths is simultaneously calibrated to said first data path.

26. A method as in claim 23, wherein at least some of said remaining data paths are calibrated to an immediately precedingly calibrated data path.

27. A method as in claim 26, wherein each of said remaining data paths is calibrated to an immediately precedingly calibrated data path.

28. A method as in claim 27, wherein each of said remaining data paths is calibrated by comparing uncalibrated data thereon to calibrated data on an immediately precedingly calibrated data path and adjusting a delay element in said remaining data path such that the data thereon aligns with and matches calibrated data in said immediately precedingly aligned data path.

29. A digital circuit for calibrating incoming data paths of a memory circuit, comprising:
    an incoming clock signal path on which a clock signal is transmitted;
    a first data path;
    a second data path;
    a control logic circuit connected to align data present on said first data path relative to said clock signal, said control logic circuit further aligning data present on said second data path relative to said clock signal by aligning data present on said second data path with aligned data on said first data path.

30. The digital circuit of claim 29 wherein said control circuit comprises a comparator circuit which compares said aligned data present on said first data path with said data present on said second data path, said control circuit using a result of said comparison to align said data present on said second data path relative to said clock signal.

31. The digital circuit of claim 30 further comprising a first delay element in said first data path, said control logic circuit adjusting a delay value of said first delay element to align data in said first data path relative to said clock signal.

32. The digital circuit of claim 31 further comprising a second delay element in said second data path, said control logic circuit adjusting a delay value of said second delay element in response to said comparison to align data in said second data path relative to said clock signal.

33. The digital circuit of claim 29, wherein said clock signal clocks in data present on said first and second data paths on at least one of a rising or failing edge of said clock signal.

34. The digital circuit of claim 29, wherein said clock signal clocks in data present on said first and second data paths on both rising and falling edges of said clock signal.

35. The digital circuit of claim 29 further comprising a third data path, wherein said control logic circuit is connected to align data present on said third data path relative to said clock signal using aligned data from one of said first and second data paths.

36. The digital circuit of claim 35 wherein said control logic circuit aligns data present on said third data path relative to said clock signal using aligned data from said first data path.

37. The digital circuit of claim 35 wherein said control logic circuit aligns data present on said third data path relative to said clock signal using aligned data from said second data path.

38. The digital circuit of claim 36 wherein said control circuit includes a comparator circuit which compares aligned data present on said first data path with said data present on said third data path, and a logic circuit to align said data present on said third data path relative to said clock signal based on a result of said comparison.

39. The digital circuit of claim 37 wherein said control circuit includes a comparator circuit which compares aligned data present on said second data path with said data present on said third data path, and a logic circuit to align said data present on said third data path relative to said clock signal based on a result of said comparison.

40. The digital circuit of claim 39, wherein said first data path is adjacent said second data path and said second data path is adjacent said third data path.

41. The digital circuit of claim 29 wherein said data present on said first and second data paths is a repeating bit pattern having an even number of bit positions.

42. The digital circuit of claim 41 wherein said bit pattern comprises an additional bit added to a pseudo random odd number bit pattern.

43. The digital circuit of claim 41 wherein said bit pattern is 1111010110010000.

44. The digital circuit of claim 29 further comprising a plurality of other data paths and a plurality of respective comparator circuits, wherein each of said respective comparator circuits compares said aligned data present on said first data path with data present on each of said respective other data paths, said control circuit using a result of each said respective comparison to align data present on each said respective other data path relative to said clock signal.

45. The digital circuit of claim 29 further comprising a plurality of other data paths and a plurality of respective comparator circuits, wherein each of said respective comparator circuits compares previously aligned data present on an adjacent other data path with data present on each of said respective other data paths in sequence, said control circuit using a result of each said respective comparison to subsequently align data present on each said respective other data path relative to said clock signal.

46. The digital circuit of claim 44 further comprising a plurality of respective delay elements in said respective other data paths, said control logic circuit adjusting a respective delay value of each said respective delay element in response to each said respective comparison to align data present on each said respective other data path to said clock signal.

47. The digital circuit of claim 45 further comprising a plurality of respective delay elements in said respective other data paths, said control logic circuit adjusting a respective delay value of each said respective delay element in response to each said respective comparison to align data present on each said respective other data path to said clock signal.

48. A semiconductor memory circuit, comprising:
a memory module;
a memory controller connected to said memory module; and
a calibration circuit for calibrating data incoming to said memory module, said calibration circuit comprising:
an incoming clock signal path on which a clock signal is transmitted;
a first data path;
a second data path;
a control logic circuit connected to align data present on said first data path relative to said clock signal, said control logic circuit further aligning data present on said second data path relative to said clock signal by aligning data present on said second data path with aligned data on said first data path.

49. The memory circuit of claim 48 wherein said control circuit comprises a comparator circuit which compares said aligned data present on said first data path with said data present on said second data path, said control circuit using a result of said comparison to align said data present on said second data path relative to said clock signal.

50. The memory circuit of claim 49 further comprising a first delay element in said first data path, said control logic circuit adjusting a delay value of said first delay element to align data in said first data path relative to said clock signal.

51. The memory circuit of claim 50 further comprising a second delay element in said second data path, said control logic circuit adjusting a delay value of said second delay element in response to said comparison to align data in said second data path relative to said clock signal.

52. The memory circuit of claim 48, wherein said clock signal clocks in data present on said first and second data paths on at least one of a rising or falling edge of said clock signal.

53. The memory circuit of claim 48, wherein said clock signal clocks in data present on said first and second data paths on both rising and failing edges of said clock signal.

54. The memory circuit of claim 48 further comprising a third data path, wherein said control logic circuit is connected to align data present on said third data path relative to said clock signal using aligned data from one of said first and second data paths.

55. The memory circuit of claim 54 wherein said control logic circuit aligns data present on said third data path relative to said clock signal using aligned data from said first data path.

56. The memory circuit of claim 54 wherein said control logic circuit aligns data present on said third data path relative to said clock signal using aligned data from said second data path.

57. The memory circuit of claim 55 wherein said control circuit includes a comparator circuit which compares aligned data present on said first data path with said data present on said third data path, and a logic circuit to align said data present on said third data path relative to said clock signal based on a result of said comparison.

58. The memory circuit of claim 56 wherein said control circuit includes a comparator circuit which compares aligned data present on said second data path with said data present on said third data path, and a logic circuit to align said data present on said third data path relative to said clock signal based on a result of said comparison.

59. The memory circuit of claim 58, wherein said first data path is adjacent said second data path and said second data path is adjacent said third data path.

60. The memory circuit of claim 48 wherein said data present on said first and second data paths is a repeating bit pattern having an even number of bit positions.

61. The memory circuit of claim 60 wherein said bit pattern comprises an additional bit added to a pseudo random odd number bit pattern.

62. The memory circuit of claim 60 wherein said bit pattern is 1111010110010000.

63. The memory circuit of claim 48 further comprising a plurality of other data paths and a plurality of respective comparator circuits, wherein each of said respective comparator circuits compares said aligned data present on said first data path with data present on each of said respective other data paths, said control circuit using a result of each said respective comparison to align data present on each said respective other data path relative to said clock signal.

64. The memory circuit of claim 48 further comprising a plurality of other data paths and a plurality of respective comparator circuits, wherein each of said respective comparator circuits compares previously aligned data present on an adjacent other data path with data present on each of said respective other data paths in sequence, said control circuit using a result of each said respective comparison to subsequently align data present on each said respective other data path relative to said clock signal.

65. The memory circuit of claim 63 further comprising a plurality of respective delay elements in said respective other data paths, said control logic circuit adjusting a respective delay value of each said respective delay element in response to each said respective comparison to align data present on each said respective other data path to said clock signal.

66. The memory circuit of claim 64 further comprising a plurality of respective delay elements in said respective other data paths, said control logic circuit adjusting a respective delay value of each said respective delay element in response to each said respective comparison to align data present on each said respective other data path to said clock signal.

67. A processor-based system, comprising:
a processor;
an integrated memory circuit connected to said processor, said integrated memory circuit including a calibration circuit comprising:
an incoming clock signal path on which a clock signal is transmitted;
a first data path;
a second data path;
a control logic circuit connected to align data present on said first data path relative to said clock signal, said control logic circuit further aligning data present on said second data path relative to said clock signal by aligning data present on said second data path with aligned data on said first data path.

68. The processor-based system of claim 67 wherein said control circuit comprises a comparator circuit which compares said aligned data present on said first data path with said data present on said second data path, said control circuit using a result of said comparison to align said data present on said second data path relative to said clock signal.

69. The processor-based system of claim 68 further comprising a first delay element in said first data path, said control logic circuit adjusting a delay value of said first delay element to align data in said first data path relative to said clock signal.

70. The processor-based system of claim 69 further comprising a second delay element in said second data path, said control logic circuit adjusting a delay value of said second delay element in response to said comparison to align data in said second data path relative to said clock signal.

71. The processor-based system of claim 67, wherein said clock signal clocks in data present on said first and second data paths on at least one of a rising or falling edge of said clock signal.

72. The processor-based system of claim 67, wherein said clock signal clocks in data present on said first and second data paths on both rising and falling edges of said clock signal.

73. The processor-based system of claim 67 further comprising a third data path, wherein said control logic circuit is connected to align data present on said third data path relative to said clock signal using aligned data from one of said first and second data paths.

74. The processor-based system of claim 73 wherein said control logic circuit aligns data present on said third data path relative to said clock signal using aligned data from said first data path.

75. The processor-based system of claim 73 wherein said control logic circuit aligns data present on said third data path relative to said clock signal using aligned data from said second data path.

76. The processor-based system of claim 74 wherein said control circuit includes a comparator circuit which compares aligned data present on said first data path with said data present on said third data path, and a logic circuit to align said data present on said third data path relative to said clock signal based on a result of said comparison.

77. The processor-based system of claim 75 wherein said control circuit includes a comparator circuit which compares aligned data present on said second data path with said data present on said third data path, and a logic circuit to align said data present on said third data path relative to said clock signal based on a result of said comparison.

78. The processor-based system of claim 77, wherein said first data path is adjacent said second data path and said second data path is adjacent said third data path.

79. The processor-based system of claim 67 wherein said data present on said first and second data paths is a repeating bit pattern having an even number of bit positions.

80. The processor-based system of claim 79 wherein said bit pattern comprises an additional bit added to a pseudo random odd number bit pattern.

81. The processor-based system of claim 79 wherein said bit pattern is 1111010110010000.

82. The processor-based system of claim 67 further comprising a plurality of other data paths and a plurality of respective comparator circuits, wherein each of said respective comparator circuits compares said aligned data present on said first data path with data present on each of said respective other data paths, said control circuit using the result of each said respective comparison to align data present on each said respective other data path relative to said clock signal.

83. The processor-based system of claim 67 further comprising a plurality of other data paths and a plurality of respective comparator circuits, wherein each of said respective comparator circuits compares previously aligned data present on an adjacent other data path with data present on each of said respective other data paths in sequence, said control circuit using the result of each said respective comparison to subsequently align data present on each said respective other data path relative to said clock signal.

84. The processor-based system of claim 82 further comprising a plurality of respective delay elements in said respective other data paths, said control logic circuit adjusting a respective delay value of each said respective delay element in response to each said respective comparison to align data present on each said respective other data path to said clock signal.

85. The processor-based system of claim 83 further comprising a plurality of respective delay elements in said respective other data paths, said control logic circuit adjusting a respective delay value of each said respective delay element in response to each said respective comparison to align data present on each said respective other data path to said clock signal.

86. An embedded-memory processor-based system, comprising:
 a processor;
 a memory circuit formed on a same integrated circuit as said processor, said memory circuit including a calibration circuit comprising:
  an incoming clock signal path on which a clock signal is transmitted;
  a first data path;
  a second data path;
  a control logic circuit connected to align data present on said first data path relative to said clock signal, said control logic circuit further aligning data present on said second data path relative to said clock signal by aligning data present on said second data path with aligned data on said first data path.

87. The embedded-memory processor-based system of claim 86 wherein said control circuit comprises a comparator circuit which compares said aligned data present on said first data path with data present on said second data path, said control circuit using a result of said comparison to align said data present on said second data path relative to said clock signal.

88. The embedded-memory processor-based system of claim 87 further comprising a first delay element in said first data path, said control logic circuit adjusting a delay value of said first delay element to align data in said first data path relative to said clock signal.

89. The embedded-memory processor-based system of claim 88 further comprising a second delay element in said second data path, said control logic circuit adjusting a delay value of said second delay element in response to said comparison to align data in said second data path relative to said clock signal.

90. The embedded-memory processor-based system of claim 86, wherein said clock signal clocks in data present on said first and second data paths on at least one of a rising or falling edge of said clock signal.

91. The embedded-memory processor-based system of claim 86, wherein said clock signal clocks in data present on said first and second data paths on both rising and falling edges of said clock signal.

92. The embedded-memory processor-based system of claim 86 further comprising a third data path, wherein said control logic circuit is connected to align data present on said third data path relative to said clock signal using aligned data from one of said first and second data paths.

93. The embedded-memory processor-based system of claim 92 wherein said control logic circuit aligns data present on said third data path relative to said clock signal using aligned data from said first data path.

94. The embedded-memory processor-based system of claim 92 wherein said control logic circuit aligns data present on said third data path relative to said clock signal using aligned data from said second data path.

95. The embedded-memory processor-based system of claim 93 wherein said control circuit includes a comparator circuit which compares aligned data present on said first data path with said data present on said third data path, and a logic circuit to align said data present on said third data path relative to said clock signal based on a result of said comparison.

96. The embedded-memory processor-based system of claim 94 wherein said control circuit includes a comparator circuit which compares aligned data present on said second data path with said data present on said third data path, and a logic circuit to align said data present on said third data path relative to said clock signal based on a result of said comparison.

97. The embedded-memory processor-based system of claim 96, wherein said first data path is adjacent said second data path and said second data path is adjacent said third data path.

98. The embedded-memory processor-based system of claim 86 wherein said data present on said first and second data paths is a repeating bit pattern having an even number of bit positions.

99. The embedded-memory processor-based system of claim 98 wherein said bit pattern comprises an additional bit added to a pseudo random odd number bit pattern.

100. The embedded-memory processor-based system of claim 98 wherein said bit pattern is 1111010110010000.

101. The embedded-memory processor-based system of claim 86 further comprising a plurality of other data paths and a plurality of respective comparator circuits, wherein each of said respective comparator circuits compares said aligned data present on said first data path with data present on each of said respective other data paths, said control circuit using the result of each said respective comparison to align data present on each said respective other data path relative to said clock signal.

102. The embedded-memory processor-based system of claim 86 further comprising a plurality of other data paths and a plurality of respective comparator circuits, wherein each of said respective comparator circuits compares previously aligned data present on an adjacent other data path with data present on each of said respective other data paths in sequence, said control circuit using the result of each said respective comparison to subsequently align data present on each said respective other data path relative to said clock signal.

103. The embedded-memory processor-based system of claim 101 further comprising a plurality of respective delay elements in said respective other data paths, said control logic circuit adjusting a respective delay value of each said respective delay element in response to each said respective comparison to align data present on each said respective other data path to said clock signal.

104. The embedded-memory processor-based system of claim 102 further comprising a plurality of respective delay elements in said respective other data paths, said control logic circuit adjusting a respective delay value of each said respective delay element in response to each said respective comparison to align data present on each said respective other data path to said clock signal.

* * * * *

UNITED STATES PATENT AND TRADEMARK OFFICE
CERTIFICATE OF CORRECTION

PATENT NO. : 6,434,081 B1
DATED : August 13, 2002
INVENTOR(S) : Brian Johnson et al.

It is certified that error appears in the above-identified patent and that said Letters Patent is hereby corrected as shown below:

<u>Title page,</u>
Item [56], References Cited: 5,917,760A 6/1999 reads, "Miller" should read -- Millar --.

<u>Column 3,</u>
Line 57, reads "used. Control" should read -- used. (new paragraph) Control --.

Signed and Sealed this

Seventeenth Day of December, 2002

JAMES E. ROGAN
*Director of the United States Patent and Trademark Office*